(12) United States Patent
Lee et al.

(10) Patent No.: US 11,296,260 B2
(45) Date of Patent: Apr. 5, 2022

(54) LIGHT EMITTING DEVICE PACKAGE AND DISPLAY APPARATUS USING THE SAME

(71) Applicant: SAMSUNG ELECTRONICS CO., LTD., Suwon-si (KR)

(72) Inventors: Jin Sub Lee, Suwon-si (KR); Deuk Seok Chung, Yongin-si (KR); Hye Seok Noh, Suwon-si (KR); Young Jin Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 76 days.

(21) Appl. No.: 16/438,948

(22) Filed: Jun. 12, 2019

(65) Prior Publication Data
US 2020/0144458 A1 May 7, 2020

(30) Foreign Application Priority Data
Nov. 5, 2018 (KR) ........................ 10-2018-0134680

(51) Int. Cl.
*H01L 33/50* (2010.01)
*H01L 33/54* (2010.01)
(Continued)

(52) U.S. Cl.
CPC ........ *H01L 33/502* (2013.01); *H01L 25/0753* (2013.01); *H01L 27/156* (2013.01); *H01L 33/32* (2013.01); *H01L 33/504* (2013.01); *H01L 33/54* (2013.01); *H01L 33/56* (2013.01); *H01L 33/60* (2013.01)

(58) Field of Classification Search
CPC ............. H01L 25/075; H01L 33/50–60; H01L 25/0753; H01L 33/504; H01L 33/54; H01L 27/156
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

KR 10-2018-0058565 A 6/2018

*Primary Examiner* — Aaron J Gray
(74) *Attorney, Agent, or Firm* — Lee IP Law, P.C.

(57) ABSTRACT

A light emitting device package including a partition structure having first and second surfaces, and first to third light emission windows penetrating through the first and second surfaces, a cell array including first to third light emitting devices on the first surface of the partition structure and overlapping the first to third light emission windows, each of the first to third light emitting devices including a first conductivity-type semiconductor layer, an active layer, and a second conductivity-type semiconductor layer, first and second wavelength conversion portions filling interiors of the first and second light emission windows, and having a meniscus-shaped interfaces, a first encapsulating portion including a light-transmissive organic film layer that fills the third light emission window and covers the first and second wavelength conversion portions, and a second encapsulating portion covering the first and second encapsulating portions and including a light-transmissive inorganic film layer.

20 Claims, 12 Drawing Sheets

(51) Int. Cl.
    *H01L 33/56*     (2010.01)
    *H01L 33/60*     (2010.01)
    *H01L 27/15*     (2006.01)
    *H01L 25/075*     (2006.01)
    *H01L 33/32*     (2010.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,825,016 B1* | 11/2017 | Kim | H01L 33/06 |
| 9,954,028 B2 | 4/2018 | Yeon et al. | |
| 9,978,907 B2 | 5/2018 | Kim et al. | |
| 2005/0212419 A1* | 9/2005 | Vazan | H01L 51/5256 |
| | | | 313/512 |
| 2015/0171372 A1 | 6/2015 | Iwata et al. | |
| 2015/0362165 A1* | 12/2015 | Chu | H01L 27/156 |
| | | | 362/235 |
| 2017/0092820 A1 | 3/2017 | Kim et al. | |
| 2018/0047880 A1* | 2/2018 | Lim | H01L 33/507 |
| 2018/0151543 A1* | 5/2018 | Lee | H01L 33/54 |
| 2018/0166424 A1 | 6/2018 | Sim et al. | |
| 2018/0182931 A1* | 6/2018 | Lee | H01L 33/50 |
| 2020/0105988 A1* | 4/2020 | Hashimoto | H01L 33/505 |

\* cited by examiner

II-II'

LIGHT EMITTING DEVICE PACKAGE AND DISPLAY APPARATUS USING THE SAME

CROSS-REFERENCE TO RELATED APPLICATION

Korean Patent Application No. 10-2018-0134680, filed on Nov. 5, 2018, in the Korean Intellectual Property Office, and entitled: "Light Emitting Device Package and Display Apparatus Using the Same," is incorporated by reference herein in its entirety.

BACKGROUND

1. Field

The present disclosure relates to a light emitting device package and a display apparatus using the same.

2. Description of the Related Art

Semiconductor light emitting devices, e.g., light emitting diodes (LEDs), are used as light sources in various electronic products and lighting devices. For example, LEDs are widely used as light sources in various display devices, e.g., a television (TV), a mobile phone, a personal computer (PC), a notebook PC, a personal digital assistant (PDA), and the like.

For example, a display device may include a display panel configured as a liquid crystal display (LCD) and a backlight. In another example, a display device may not require a backlight by using a LED device as a single pixel. Display devices using LEDs as pixels may be compact, and may also be implemented as high luminance displays having excellent luminous efficiency, e.g., as compared to LCDs. A display device using LEDs as pixels may include a plurality of light emitting device packages constituting each pixel.

SUMMARY

According to an aspect of the present disclosure, a light emitting device package includes a partition structure having a first surface and a second surface opposing the first surface, and including first to third light emission windows penetrating through the first surface and the second surface and spaced apart from each other, a cell array including first to third light emitting devices, the first to third light emitting devices each including a first conductivity-type semiconductor layer, an active layer and a second conductivity-type semiconductor layer, and being disposed on the first surface to overlap the first to third light emission windows, respectively, first and second wavelength conversion portions filling interiors of the first and second light emission windows and having an interface at which a meniscus, concave in a direction of the second surface, is formed, a first encapsulating portion filling an interior of the third light emission window, covering the first and second wavelength conversion portions, and formed of a light-transmissive organic film layer, and a second encapsulating portion covering the first encapsulating portion and formed of a light-transmissive inorganic film layer.

According to an aspect of the present disclosure, a light emitting device package includes a partition structure including first to third light emission windows spaced apart from each other in a thickness direction, first and second wavelength conversion portions filling interiors of the first and second light emission windows, respectively, and configured to convert incident light into light having a different wavelength, a cell array including first to third light emitting devices, the first to third light emitting devices each including a first conductivity-type semiconductor layer, an active layer and a second conductivity-type semiconductor layer, and being disposed to overlap the first to third light emission windows, respectively, first and second wavelength conversion portions filling interiors of the first and second light emission windows and having an interface at which a meniscus, concave in a direction of the second surface, is formed, a first encapsulating portion filling an interior of the third light emission window, covering the first and second wavelength conversion portions to form a flat surface, and formed of a light-transmissive organic film layer, and a second encapsulating portion covering the first encapsulating portion and formed of a light-transmissive inorganic film layer.

According to an aspect of the present disclosure, a display apparatus includes a display panel including a circuit board and a plurality of light emitting device packages disposed in rows and columns on the circuit board, each of the plurality of light emitting device packages providing one pixel, a driving unit driving the display panel, and a controller controlling the driving unit. Each of the plurality of light emitting device packages includes a partition structure having a first surface and a second surface opposing the first surface, and including first to third light emission windows penetrating through the first surface and the second surface and spaced apart from each other, a cell array including first to third light emitting devices, the first to third light emitting devices each including a first conductivity-type semiconductor layer, an active layer and a second conductivity-type semiconductor layer, and being disposed on the first surface to overlap the first to third light emission windows, respectively, first and second wavelength conversion portions filling interiors of the first and second light emission windows, and having an interface at which a meniscus, concave in a direction of the second surface, is formed, a first encapsulating portion filling an interior of the third light emission window, covering the first and second wavelength conversion portions, and formed of a light-transmissive organic film layer, and a second encapsulating portion covering the first encapsulating portion and formed of a light-transmissive inorganic film layer.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, various embodiments of the present disclosure will be described in detail with reference to the accompanying drawings.

Figure 1:
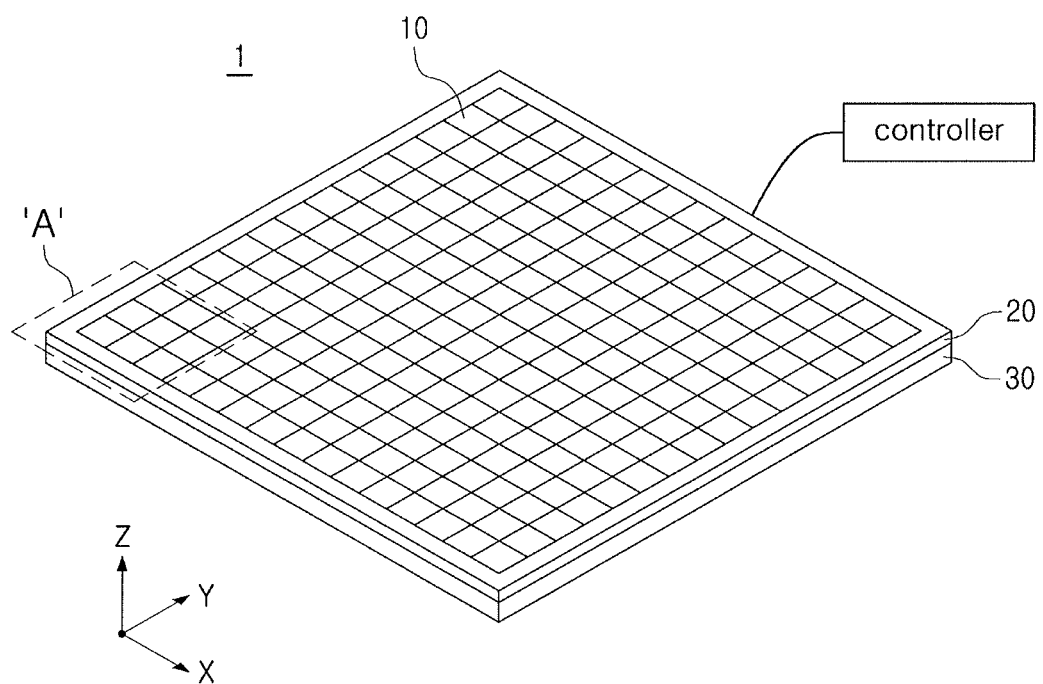
FIG. 1 illustrates a schematic perspective view of a display apparatus including a light emitting device package according to an example embodiment.
Figure 2:
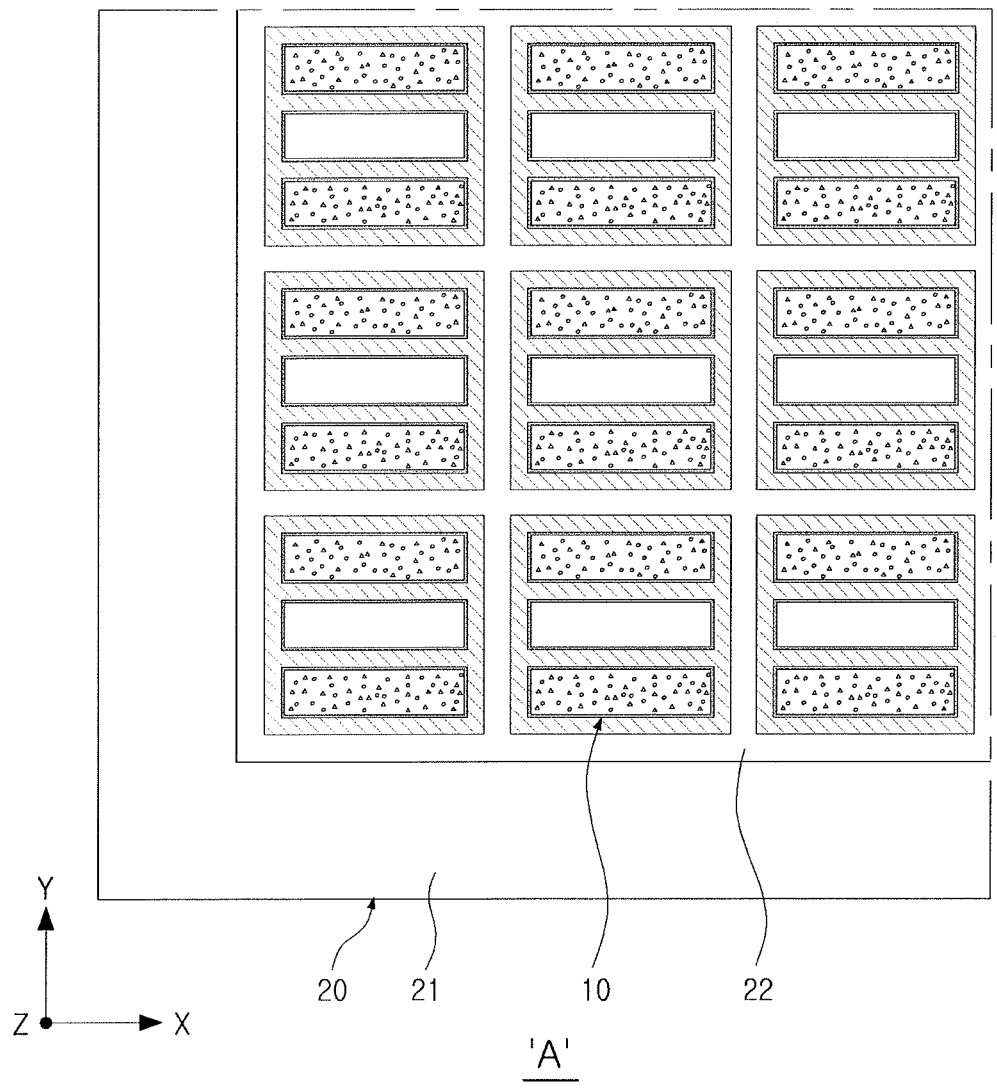
FIG. 2 illustrates an enlarged plan view of portion 'A' in FIG. 1.

FIG. 1 is a schematic perspective view of a display apparatus including a light emitting device package according to an example embodiment, and FIG. 2 is an enlarged plan view of portion 'A' of FIG. 1.

Referring to FIG. 1, a display apparatus 1 may include a circuit board 30 and a display panel 20 disposed on the circuit board 30.

The display panel 20 according to the example embodiment may include a plurality of light emitting device packages 10 capable of emitting mixture red (R), green (G), and blue (B) light. Each of the plurality of light emitting device packages 10 may constitute one pixel of the display panel 20, and may be arranged in rows and columns on the circuit board 30. In this embodiment, although a configuration in which the light emitting device packages 10 are arranged in a grid of 15×15 is illustrated for convenience of explanation, a relatively large number of light emitting device packages 10, e.g., 1024×768, 1920×1080, 3840×2160, or 7680×4320, may be disposed.

Each of the light emitting device packages 10 may include a plurality of subpixels corresponding to RGB light sources, and a plurality of subpixels in one light emitting device package 10 may be disposed to be adjacent to each other, which will be described in detail with reference to FIGS. 3 to 6, but the subpixel color is not limited to RGB. For example, various colors, e.g., cyan, yellow, magenta and black (CYMK), may be used. In addition, this embodiment illustrates that three subpixels corresponding to RGB light sources, respectively, are included in one pixel, but an example embodiment thereof is not limited thereto, e.g., four or more subpixels may be included in one pixel.

The circuit board 30 may include a driving unit configured to supply power to respective light emitting device packages 10 of the display panel 20, and a controller controlling the driving unit. The circuit board 30 may include a circuit configured to independently drive the subpixels of each pixel. For example, the circuit board 30 may be a TFT substrate including a thin film transistor (TFT).

Referring to FIG. 2, the display panel 20 may include a first molding portion 21 and a second molding portion 22. The first molding portion 21 may be disposed around the, e.g., entire perimeter of the, display panel 20 to serve as a guide line defining a region on which the plurality of light emitting device packages 10 are mounted. The second molding portion 22 may be disposed to surround the plurality of respective light emitting device packages 10, e.g., the second molding portion 22 may have a grid pattern to surround each of the light emitting device packages 10. The second molding portion 22 electrically isolates respective light emitting device packages 10 such that the respective light emitting device packages 10 may be independently driven as respective single pixels. In addition, the second molding portion 22 may firmly fix the plurality of light emitting device packages 10 to the circuit board 30. The first and second molding portions 21 and 22 may be omitted depending on an example embodiment.

For example, the first and second molding portions 21 and 22 may include a black matrix. However, the matrix is not limited to a black matrix, and matrices of other colors, e.g., a white matrix, a green matrix or the like, may be used depending on the use and a place of use of a product. If necessary, a transparent matrix may also be used. The white matrix may further include a reflective material or a scattering material. The black matrix may include at least one of materials, e.g., a ceramic, a semiconductor or a metal, or a polymer including a resin.

Figure 3:
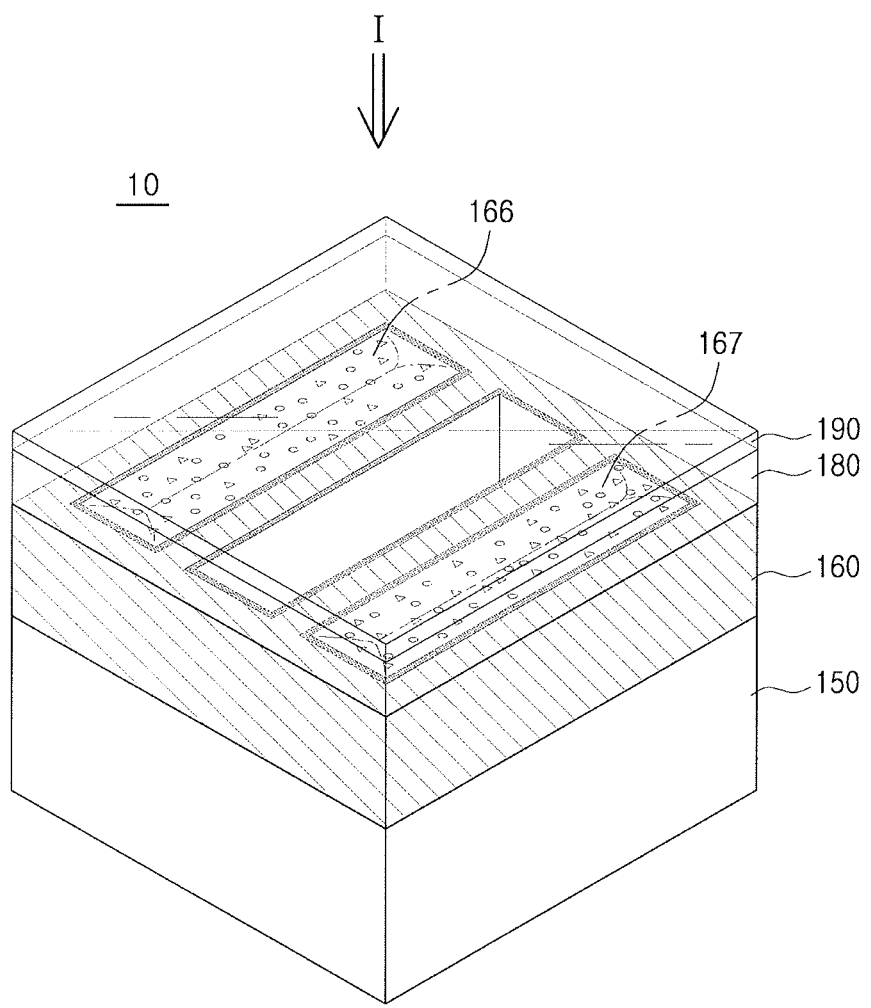
FIG. 3 illustrates a schematic perspective view of a light emitting device package of FIG. 2.
Figure 4:
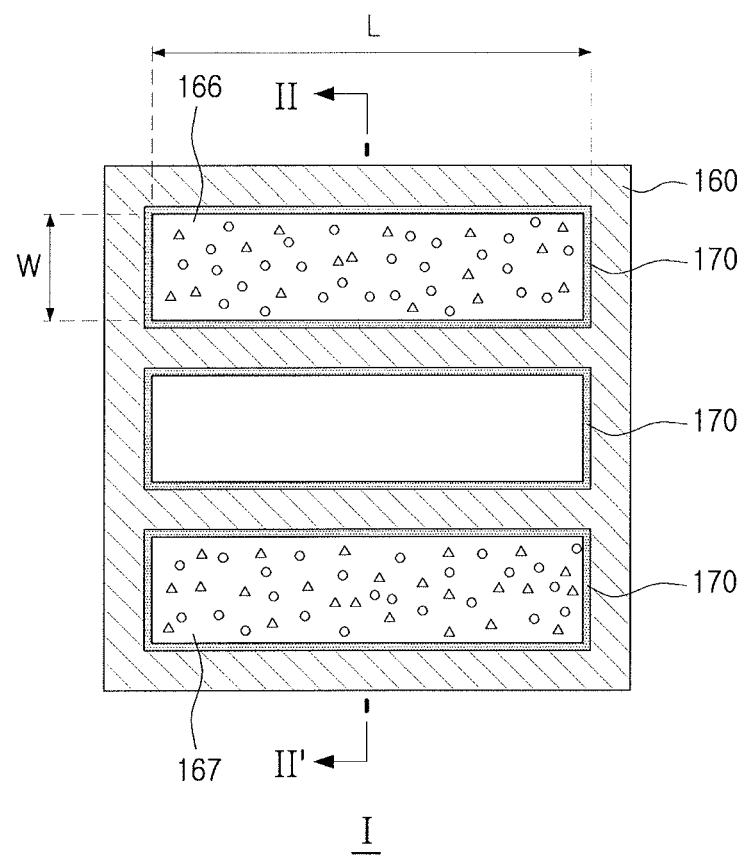
FIG. 4 illustrates a plan view of the light emitting device package when viewed in a direction I of FIG. 3.
Figure 5:
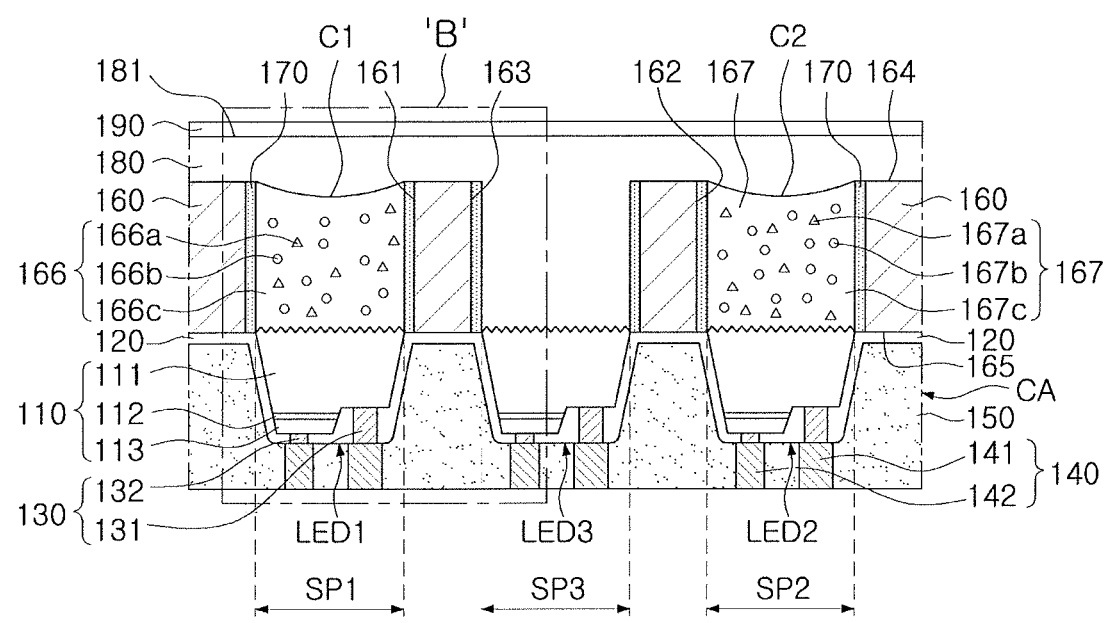
FIG. 5 illustrates a cross-sectional view taken along line II-II' of FIG. 4.
Figure 6:
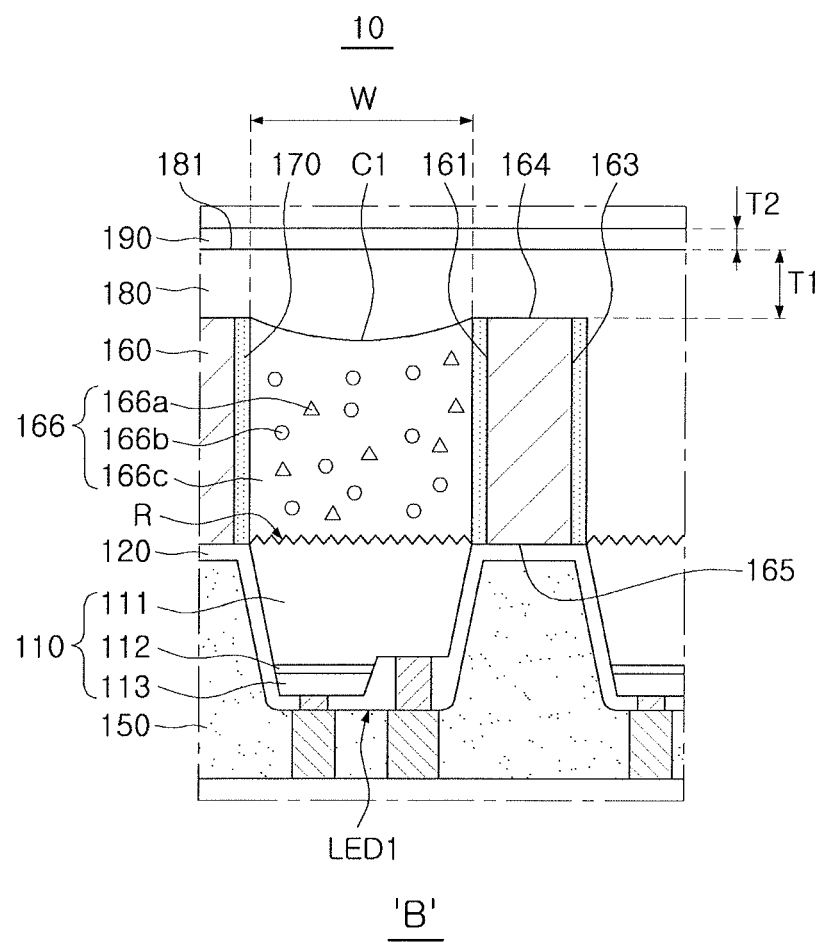
FIG. 6 illustrates an enlarged view of portion 'B' in FIG. 5.

FIG. 3 is a schematic perspective view of one light emitting device package 10, and FIG. 4 is a plan view of the light emitting device package 10 when viewed in direction I of FIG. 3. FIG. 5 is a cross-sectional view taken along line II-IF of FIG. 4, and FIG. 6 is an enlarged view of portion 'B' of FIG. 5. First to third light emitting devices LED1, LED2 and LED3 of FIG. 5 may be understood as light emitting devices corresponding to first to third subpixels SP1, SP2 and SP3, respectively.

Referring to FIGS. 3 to 5, the light emitting device package 10 forming one pixel may include a partition structure 160 having first to third light emission windows 161, 162 and 163, a cell array CA including the first to third light emitting devices LED1, LED2 and LED3, first and second wavelength conversion portions 166 and 167, a first encapsulating portion 180, and a second encapsulating portion 190. The light emitting device package 10 in an embodiment may be a chip scale package (CSP) or a wafer level package (WLP).

The light emitting device package 10 may include the first to third subpixels SP1, SP2 and SP3 corresponding to RGB light sources of one pixel, respectively. The first and second subpixels SP1 and SP2 include the first and second light emitting devices LED1 and LED2 and the first and second wavelength conversion portions 166 and 167, respectively. In the case of the third subpixel SP3, the first encapsulating portion 180 may fill the third light emission window 163 without a separate wavelength conversion portion on the third light emitting device LED3, i.e., the third subpixel SP3 includes the third light emitting device LED3 with a portion of the first encapsulating portion 180 directly thereon. Thus, light emitted from the first and second light emitting devices LED1 and LED2 may be converted into light having a different wavelength through the first and second wavelength conversion portions 166 and 167, respectively, to be emitted outside of the light emitting device package 10, and light emitted from the third light emitting device LED3 may be emitted to the outside of the light emitting device package 10 without wavelength conversion.

The first to third light emitting devices LED1, LED2 and LED3 are disposed adjacent to each other, e.g., in parallel to each other, in such a manner that the third light emitting device LED3 is disposed between the first light emitting device LED1 and the second light emitting device LED2. In this case, the first to third light emitting devices LED1, LED2 and LED3 may be disposed closely to each other within a range of not electrically affecting each other. The first to third light emitting devices LED1, LED2 and LED3 are each provided as a subpixel constituting one pixel, and thus, may be formed to have substantially the same size as that of the first to third light emission windows 161, 162 and 163.

The cell array CA may include the first to third light emitting devices LED1, LED2 and LED3, each light emitting device having a first conductivity-type semiconductor layer 111, an active layer 112, and a second conductivity-type semiconductor layer 113. That is, each of the first to third light emitting devices LED1, LED2 and LED3 may include a light emitting structure 110 in which epitaxial layers, such as the first conductivity-type semiconductor layer 111, the active layer 112, and the second conductivity-type semiconductor layer 113, are stacked, as illustrated in FIGS. 5 and 6. These epitaxial layers may be grown by the same process on one wafer.

The active layers 112 of the first to third light emitting devices LED1, LED2 and LED3 may be configured to emit light of the same wavelength. For example, the active layer 112 may emit blue light of, e.g., 440 nm to 460 nm. The first to third light emitting devices LED1, LED2 and LED3 may have the same structure, and mainly the first light emitting device LED1 will be described to avoid duplication of description.

The first conductivity-type semiconductor layer 111 may provide one surface, i.e., a first surface, of the cell array CA, and the second conductivity-type semiconductor layer 113 may provide the other surface, i.e., a second surface opposite the first surface, of the cell array CA. The first conductivity-type semiconductor layer 111 and the second conductivity-type semiconductor layer 113 may be an n-type semiconductor layer and a p-type semiconductor layer, respectively. For example, the first conductivity-type semiconductor layer 111 and the second conductivity-type semiconductor layer 113 may be nitride semiconductor layers of $Al_xIn_yGa_{(1-x-y)}N (0 \leq x \leq 1, 0 \leq y \leq 1, 0 \leq x+y \leq 1)$.

The active layer 112 may have a multiple quantum well (MQW) structure in which a quantum well layer and a quantum barrier layer are alternately stacked. For example, the active layer 112 may have a nitride-based MQW structure, e.g., an InGaN/GaN or GaN/AlGaN structure, but the structure thereof is not limited thereto. The active layer 112 may be a different semiconductor, e.g., GaAs/AlGaAs, InGaP/GaP or GaP/AlGaP. According to an example embodiment, a concavo-convex portion R may be formed on one surface of the cell array CA, e.g., the concavo-convex portion R may be formed on the first surface of the cell array CA defined by the first conductivity-type semiconductor layer 111 (FIG. 6), thereby further improving light extraction efficiency. The concavo-convex portion R may be obtained by wet-etching an exposed surface of the first conductivity-type semiconductor layer 111 or by dry-etching the exposed surface of the first conductivity-type semiconductor layer 111 using plasma.

The cell array CA may include an insulating layer 120 disposed on the second surface thereof to respectively surround the first to third light emitting devices LED1, LED2 and LED3. For example, as illustrated in FIG. 6, the insulating layer 120 may extend on sidewalls of the lower molding portion 150 of the cell array CA to separate between the lower molding portion 150 and each of the first to third light emitting devices LED1, LED2 and LED3. The insulating layer 120 may electrically isolate the first, second, and third light emitting devices LED1, LED2 and LED3 from each other.

As further illustrated in FIG. 6, the insulating layer 120 may be disposed to be in contact with a reflective layer 170 to be described later, to prevent the occurrence of a light leakage phenomenon among the first, second and third subpixels SP1, SP2 and SP3. For example, light emitted by the first light emitting device LED1 may be optically shielded by the reflective layer 170 from interfering with light emitted by the second and third light emitting devices LED2 and LED3.

The insulating layer 120 may be formed of an electrically insulating material. For example, the insulating layer 120 may be formed of a silicon oxide, a silicon oxynitride, or a silicon nitride. In addition, the insulating layer 120 may further include a material having a relatively low light absorption rate or reflective properties or may have a reflective structure. The insulating layer 120 prevents mutual optical interference between the first to third light emitting devices LED1, LED2 and LED3, to secure independent driving of the first to third light emitting devices LED1, LED2 and LED3. In a specific example, the insulating layer 120 may include a distributed Bragg reflector (DBR) structure in which a plurality of insulating films having different refractive indices are alternately stacked.

As illustrated in FIG. 5, each of the first to third light emitting devices LED1, LED2 and LED3 may include an electrode portion 130 respectively applying power to the first conductivity-type semiconductor layer 111 and the second conductivity-type semiconductor layer 113. The electrode portion 130 may include first and second electrodes 131 and 132. The first and second electrodes 131 and 132 may be disposed in a mesa-etched region of the first conductivity-type semiconductor layer 111 and the second conductivity-type semiconductor layer 113, respectively. For example, as illustrated in FIG. 5, the first and second electrodes 131 and 132 may extend vertically through the insulating layer 120 to contact the first conductivity-type semiconductor layer 111 and the second conductivity-type semiconductor layer 113.

For example, the first electrode 131 may include at least one of aluminum (Al), gold (Au), chromium (Cr), nickel (Ni), titanium (Ti) and tin (Sn), and the second electrode 132 may be formed of a reflective metal. For example, the second electrode 132 may include a material such as silver (Ag), Ni, Al, Cr, rhodium (Rh), palladium (Pd), iridium (Ir), ruthenium (Ru), magnesium (Mg), zinc (Zn), platinum (Pt), Au, or the like, and may be employed in a single layer or a two or more layer structure.

As further illustrated in FIG. 5, each of the first to third light emitting devices LED1, LED2 and LED3 may include an electrode pad portion 140 applying power to the light emitting device package 10. The electrode pad portion 140 may include first and second electrode pads 141 and 142. The first and second electrode pads 141 and 142 may be connected to the first and second electrodes 131 and 132, respectively. For example, as illustrated in FIG. 5, the first and second electrode pads 141 and 142 may extend vertically through the lower molding portion 150 to contact the first and second electrodes 131 and 132, respectively.

The light emitting device package 10 may include the lower molding portion 150 exposing, e.g., an upper surface of, the electrode pad portion 140 while embedding a lower surface of the cell array CA. For example, as illustrated in FIG. 5, the lower molding portion 150 may have a predetermined thickness in a vertical direction, and recesses in the lower molding portion 150 may accommodate the first to third light emitting devices LED1, LED2 and LED3 therein, respectively, e.g., so each recess in the lower molding portion 150 may include the insulating layer 120 along sidewalls and bottom thereof and the stacked structure of the first conductivity-type semiconductor layer 111, the active layer 112, and the second conductivity-type semiconductor layer 113 on the insulating layer 120.

The lower molding portion 150 may have a relatively high Young's modulus to firmly support the light emitting device package 10. In addition, the lower molding portion 150 may include a material having relatively high thermal conductivity to effectively dissipate heat generated from the first to third light emitting devices LED1, LED2 and LED3. For example, the lower molding portion 150 may include an epoxy resin or a silicone resin. In addition, the lower molding portion 150 may include light reflective particles to reflect light. As the light-reflective particles, titanium dioxide (TiO$_2$) or aluminum oxide (Al$_2$O$_3$) particles may be used, but the light-reflective particles are not limited thereto.

The first to third light emitting devices LED1, LED2 and LED3 may be disposed to have the same area when viewed in direction I (top view), but an example embodiment thereof is not limited thereto. For example, the first to third light emitting devices LED1, LED2 and LED3 may be disposed to have different areas.

As illustrated in FIG. 3, the partition structure 160 may be positioned on the lower molding portion 150, such that the first to third light emission windows 161, 162 and 163 I the partition structure 160 overlap and are aligned with the recesses in the lower molding portion 150 (FIG. 5). The partition structure 160 may have a first surface 164 and a second surface 165 opposing the first surface 164. The second surface 165 may be disposed to face, e.g., and in contact with, the first conductivity-type semiconductor layer 111 of the cell array CA. The first and second light emission windows 161 and 162 among the first to third light emission windows 161, 162 and 163 may be provided as spaces in which the first and second wavelength conversion portions 166 and 167 are to be formed, respectively.

The first to third light emission windows 161, 162 and 163 may be formed to penetrate through the partition structure 160 in a thickness direction, and may be spaced apart from each other. The first to third light emission windows 161, 162 and 163 may be disposed in areas overlapping the first to third light emitting devices LED1, LED2 and LED3, respectively. Therefore, light emitted from the first and second light emitting devices LED1 and LED2 may be emitted through the first and second wavelength conversion portions 166 and 167 formed in the first and second light emission windows 161 and 162, and light emitted from the third light emitting device LED3 may be emitted through the third light emission window 163.

The partition structure 160 may include a light blocking material to prevent light emitted through the first to third light emission windows 161, 162 and 163 from interfering with each other. In addition, the partition structure 160 may be formed of an insulating material. For example, the partition structure 160 may be formed of at least one of SiO$_2$, SiN$_x$, Al$_2$O$_3$, HfO or ZrO. In addition, the partition structure 160 may be prepared by etching a wafer used as a growth substrate on which the first to third light emitting devices LED1, LED2 and LED3 are to be grown.

The first and second wavelength conversion portions 166 and 167 may be disposed in the first and second light emission windows 161 and 162, respectively. The first and second wavelength conversion portions 166 and 167 may be disposed on surfaces in contact with the first and second light emitting devices LED1 and LED2.

The first to third light emission windows 161, 162 and 163 may be modified to have various shapes. For example, as illustrated in FIGS. 3 to 5, the first to third light emission windows 161, 162 and 163 may be formed to have space portions having a rectangular prismatic shape when viewed from above, in direction I. In an example embodiment, as illustrated in FIG. 4, the first to third light emission windows 161, 162 and 163 may be disposed in such a manner that lengths L and widths W thereof are substantially the same as each other, respectively. In detail, each of the first to third light emission windows 161, 162 and 163 may have a rectangular prismatic-shaped space portion having a length L, e.g., of 130 μm or less, and a width W, e.g., of 30 μm or less.

The first and second wavelength conversion portions 166 and 167 may be respectively formed, using a wavelength converting material such as at least one-type phosphor or quantum dots (QDs) dispersed in a liquid binder resin, to fill the light emission windows 161 and 162 and then be cured. In an example embodiment, the first and second wavelength conversion portions 166 and 167 may include quantum dots capable of wavelength converting blue light into red light and green light, respectively.

In detail, the first and second wavelength conversion portions 166 and 167 may be formed by filling the light emission windows 161 and 162 with a liquid photosensitive resin composition in which red quantum dots 166$a$ and green quantum dots 167$a$ are dispersed in binder resins 166$c$ and 167$c$, respectively, and then by curing the resultant. The binder resin may be formed of a material including an acrylic polymer. The binder resin may be formed of the same material as that of the first encapsulating portion 180 to be described later. In an example embodiment, the first and second wavelength conversion portions 166 and 167 may include light reflective particles 166$b$ and 167$b$ for improving light extraction efficiency. As a material of the light reflective particles 166$b$ and 167$b$, titanium dioxide (TiO$_2$) may be used, but the material thereof is not limited thereto.

When the first and second light emission windows 161 and 162 are filled with the liquid photosensitive resin composition, meniscuses C1 and C2 may be formed on a surface of the photosensitive resin composition due to a capillary phenomenon. The meniscus may become more concave in the course of curing the photosensitive resin composition.

As described above, due to the meniscuses C1 and C2 formed on the surfaces of the first and second wavelength conversion portions 166 and 167, an encapsulating portion having relatively low ductility may be formed on the first and second wavelength conversion portions 166 and 167, causing cracking CR in a region in which the encapsulating portions and the meniscuses contact each other, which will be described in detail below with reference to FIG. 6. Since the second wavelength conversion portion 167 has the same structure as above, mainly the first wavelength conversion portion 166 will be described below.

Referring to FIG. 6, the first and second encapsulating portions 180 and 190 may be disposed on the partition structure 160 and the first and second wavelength conversion portions 166 and 167 to prevent deterioration of a wavelength conversion material. The first encapsulating portion 180 may be disposed to be in contact with the first and second wavelength conversion portions 166 and 167 and the partition structure 160, and to be used as an optical waveguide for transmitting light emitted from the first and second wavelength conversion portions 166 and 167 and the partition structure 160. For example, as illustrated in FIG. 6, the first encapsulating portion 180 may fill the third light emission window 163 and continuously extend from the third light emission window 163 above the partition structure 160 to contact the first surface 164 of the partition structure 160 and the first and second wavelength conversion portions 166 and 167 in the first and second light emission windows 161 and 162, respectively.

The first encapsulating portion 180 may be formed of a light-transmissive organic film layer, and may be formed of a material having the same composition as that of the binder resin of the first and second wavelength conversion portion 166 and 167. In an example embodiment, the first encapsulating portion 180 may be formed of a material including an acrylic polymer. The first encapsulating portion 180 may be stacked on the first surface 164 of the partition structure 160 to have a sufficient thickness T1 to cover the first and second wavelength conversion portions 166 and 167 while filling the third light emission window 163. Thus, an upper surface 181 of the first encapsulating portion 180 may have a flat surface. It is noted that the thickness T1 refers to a vertical thickness of the first encapsulating portion 180 measured from the first surface 164 of the partition structure 160 to the upper surface 181 of the first encapsulating portion 180, i.e., without the material in the third light emission window 163.

The second encapsulating portion 190 may be disposed on the first encapsulating portion 180, and may be formed of a transparent inorganic film layer. In an example embodiment, the second encapsulating portion 190 may be formed of SiON.

Referring to FIG. 6, the meniscus C1 may be formed on the surface of the first wavelength conversion portion 166, and the first and second encapsulating portions 180 and 190 may be formed on the first wavelength conversion portion 166. The first encapsulating portion 180 may be disposed to fill the third light emission window 163 and cover the first wavelength conversion portion 166. Thus, a lower surface of the first encapsulating portion 180 in contact with the meniscus C1 of the first wavelength conversion portion 166 may have a downward convex interface region, and the upper surface 181 of the first encapsulating portion 180 may have a flat surface. The first encapsulating portion 180 may be formed of a material having the same composition as that of the binder resin of the first wavelength conversion portion 166. For example, the first encapsulating portion 180 may be formed of a material including an acrylic polymer, the same as the binder resin. Thus, the first encapsulating portion 180 may have a coefficient of thermal expansion (CTE) similar to that of the first wavelength conversion portion 166. The first encapsulating portion 180 may be formed to have a thickness T1 sufficient to cover the first surface 164 of the partition structure 160 while having a flat upper surface.

The thickness T1 of the first encapsulating portion 180 may be greater than a thickness T2 of the second encapsulating portion 190. Contrary to embodiments, if the thickness T2 of the second encapsulating portion 190 were to be greater than the thickness T1 of the first encapsulating portion 180, stress of the second encapsulating portion 190 would have been greater than stress of the first encapsulating portion 180, such that cracking could have occurred in the first encapsulating portion 180.

If the thickness T1 of the first encapsulating portion 180 is excessively great, light totally reflected at the upper surface 181 of the first encapsulating portion 180, in light emitted from the first wavelength conversion portion 166, may be directed to the third light emission window 163 adjacent thereto, causing mixing of light of subpixels. In an example embodiment, the thickness T1 of the first encapsulating portion 180 may be 10 µm or less. The thickness T1 of the first encapsulating portion 180 may be 30% or less of the width W of the first light emission window 161.

For example, if the first encapsulating portion 180 were to fill only the third light emission window 163, and the second encapsulating portion 190 were to be positioned directly on the first wavelength conversion portion 166 (without the first encapsulating portion 180 separating therebetween), cracking could have occurred in the second encapsulating portion 190 directly on the first wavelength conversion portion 166. That is, due to a CTE difference between the first wavelength conversion portion 166 and the second encapsulating portion 190, and a CTE difference between the partition structure 160 and the second encapsulating portion 190, the transparent inorganic film layer in the second encapsulating portion 190 could have cracked. Such potential cracking in the second encapsulating portion 190 could have been concentrated in a portion relatively vulnerable to impacts in which the meniscus C1 of the first wavelength conversion portion 166 and the second encapsulating portion 190 contact each other. Further, such cracking could have caused the first wavelength conversion portion 166 to contact air (through the cracking), which could have increased deterioration of the first wavelength conversion portion 166 and lowered reliability of the light emitting device package 10.

In a case in which the encapsulating portion is formed of a light-transmissive inorganic film layer, an effect of blocking air may be excellent, but ductility may be relatively low and cracks may be likely to occur due to external impact or stress difference. On the other hand, in a case in which the encapsulating portion is formed of an organic film layer, the effect of blocking air may be relatively low as compared to the inorganic film layer, but since ductility is relatively high, cracking does not easily occur, even in a case in which an external impact or stress difference occurs.

Therefore, according to embodiments, the first encapsulating portion 180 is a light-transmissive organic film layer, which is disposed below the second encapsulating portion 190, which is a light-transmissive inorganic film layer, to obtain high ductility of the organic film layer and an air-blocking effect of the inorganic film layer at the same time. In addition, a flat surface of the first encapsulating portion 180 is brought into contact with a lower portion of the second encapsulating portion 190, such that a curved surface may be formed on the inorganic film layer having relatively low ductility, to be prevented from being vulnerable to impacts. Therefore, since cracks are prevented from occurring in the encapsulating portion, reliability of the light emitting device package may be improved.

As illustrated in FIG. 5, the reflective layer 170 may be respectively disposed on side surfaces of the first to third light emission windows 161, 162, and 163, to reflect light emitted from the first to third light emitting devices LED1, LED2, and LED3. The reflective layer 170 may be disposed to cover the side surfaces of the first to third light emission windows 161, 162, and 163. For example, as illustrated in FIG. 4, the reflective layer 170 may surround the entire perimeter of each of the first to third light emission windows 161, 162, and 163, along the entire height of each of the first to third light emission windows 161, 162, and 163. Thus, by the reflective layer 170, light emitted from the first to third light emitting devices LED1, LED2, and LED3 may pass through the interior of the partition structure 160, such that leakage of light between the first to third subpixels SP1, SP2, and SP3 may be prevented from occurring. For example, the light emitted from the first to third light emitting devices LED1, LED2, and LED3 may be optically shielded from interfering with each other. The reflective layer 170 may reflect the light emitted from the first to third light emitting devices LED1, LED2 and LED3, to allow the light to be concentrated on the front of the light emitting device package 10 in direction I of FIG. 3. The reflective layer 170 may be formed of a high reflectivity metal material including at least one of, e.g., aluminum (Al), ruthenium (Ru), rhodium (Rh), gold (Au), silver (Ag), platinum (Pt), nickel (Ni), chromium (Cr), titanium (Ti), and copper (Cu).

Next, a process of manufacturing a light emitting device package will be described with reference to FIGS. 7 to 12. FIGS. 7 to 12 are schematic side cross-sectional views illustrating main processes of manufacturing the light emitting device package of FIG. 5. Configurations of the same reference numerals as those of the light emitting device package 10 described above will be omitted to avoid duplication of description.

In detail, a method of manufacturing the light emitting device package may be related to a method of manufacturing a chip scale package. Such a chip scale package may be implemented to have substantially the same package size as a semiconductor light emitting device. Thus, for example, when the chip scale package is used in a display panel, a relatively high-resolution display panel may be manufactured by reducing a pixel size and a pixel pitch. In addition, all the processes are performed at a wafer level, and thus, this method may be suitable for mass production. Furthermore, in this case, an optical structure such as a wavelength converter and an optical filter may be integrally manufactured together with a light emitting structure.

Figure 7:
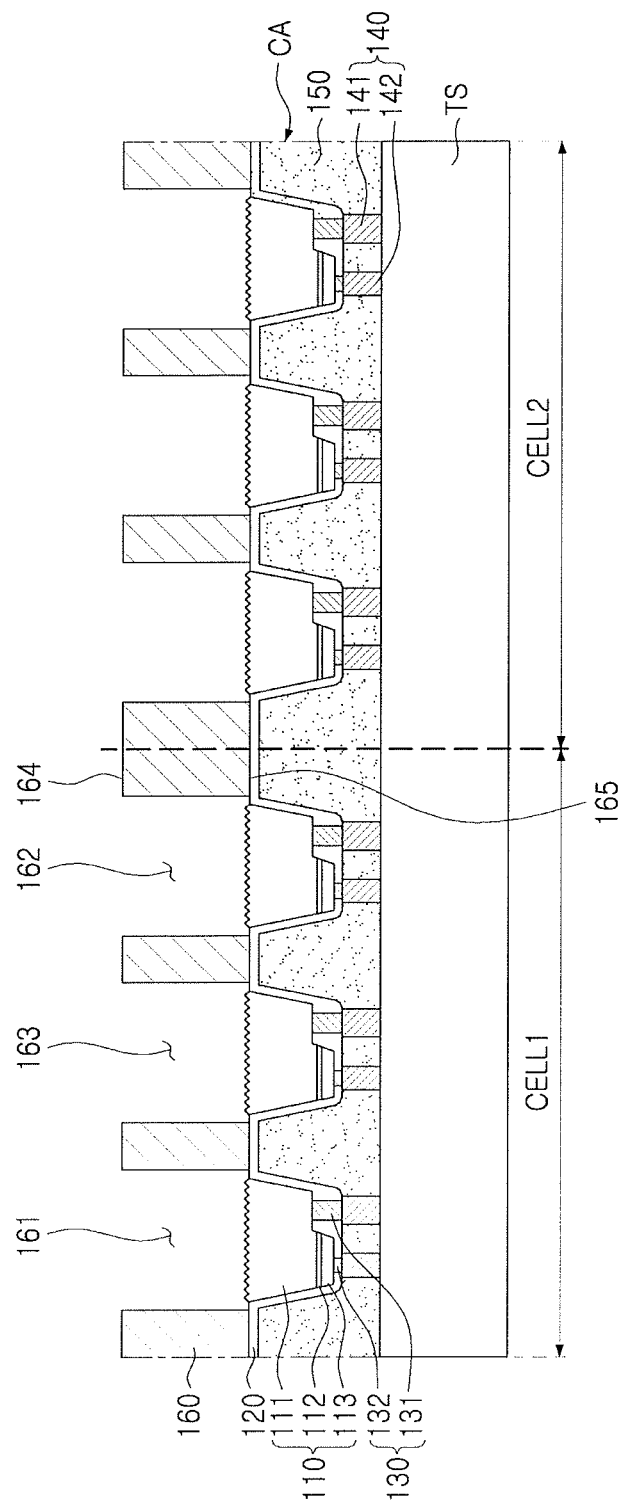
FIGS. 7 to 12 illustrate schematic side cross-sectional views of a main manufacturing process of the light emitting device package of FIG. 5.

As illustrated in FIG. 7, the cell array CA including the light emitting structure 110 each including the first conductivity-type semiconductor layer 111, the active layer 112, and the second conductivity-type semiconductor layer 113, the insulating layer 120 respectively surrounding the light emitting structure 110, the electrode portion 130 and the electrode pad portion 140, and the lower molding portion 150 embedding the lower surface of the cell array CA may be prepared in a state in which a temporary substrate TS is attached thereto. The first to third light emission windows 161, 162, and 163 may be formed by etching a portion of a growth substrate on which the light emitting structure 110 is grown, thereby providing the partition structure 160.

The first to third light emission windows 161, 162, and 163 may be formed by etching regions corresponding to the first to third light emitting devices LED1, LED2, and LED3, respectively. The first to third light emission windows 161, 162, and 163 may be repeatedly provided in pixel units CELL1 and CELL2. The first to third light emission windows 161, 162, and 163 may be formed by dry etching a growth substrate using a method such as oxide-deep reactive ion etching (oxide-DRIE). In addition to this method, various dry or wet etching methods used in the art may be used. As described above, the partition structure 160 may be formed of an insulating material, and may be formed of at least one of $SiO_2$, $SiN_x$, $Al_2O_3$, HfO, $TiO_2$ or ZrO.

Figure 8:
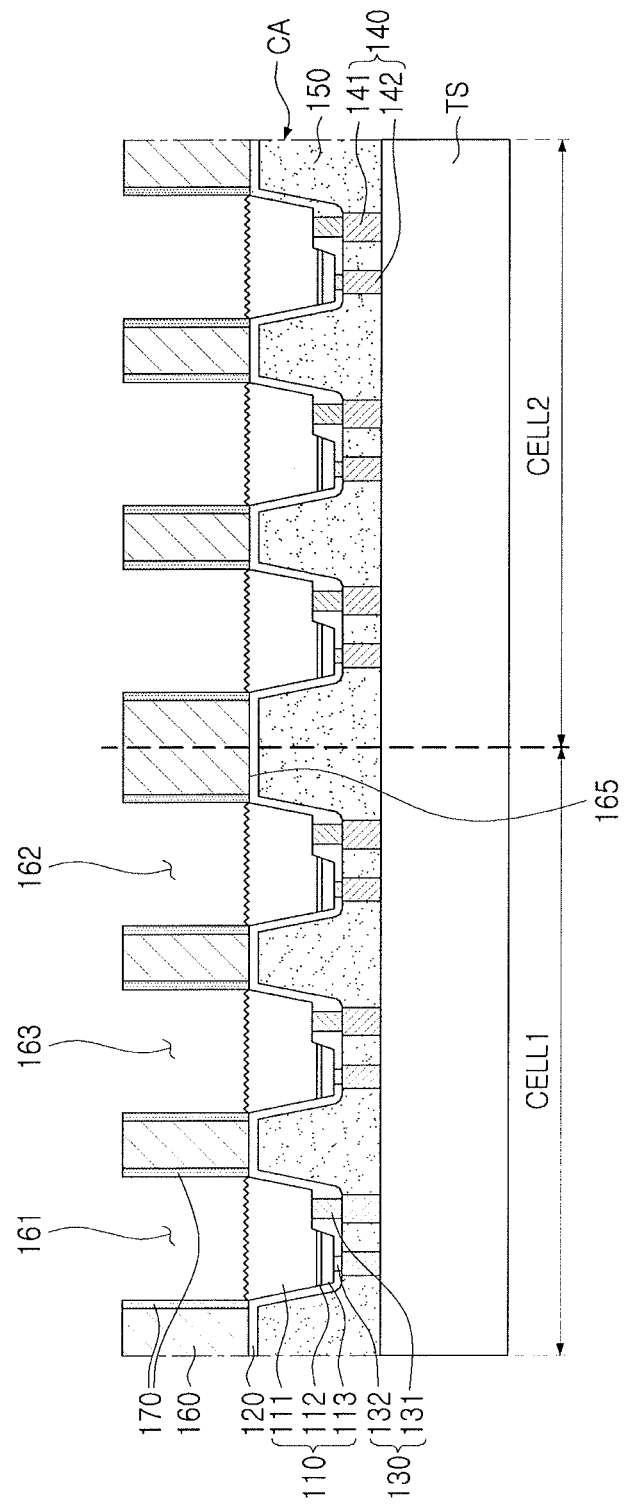

Next, as illustrated in FIG. 8, the reflective layer 170 may be formed on side surfaces of the first to third light emission windows 161, 162, and 163. The reflective layer 170 may be formed by depositing a material including at least one of aluminum (Al), ruthenium (Ru), rhodium (Rh), gold (Au), silver (Ag), platinum (Pt), nickel (Ni), chromium (Cr), titanium (Ti) and copper (Cu), which are high reflective metals. The reflective layer 170 may be in contact with the insulating layer 120.

Figure 9:
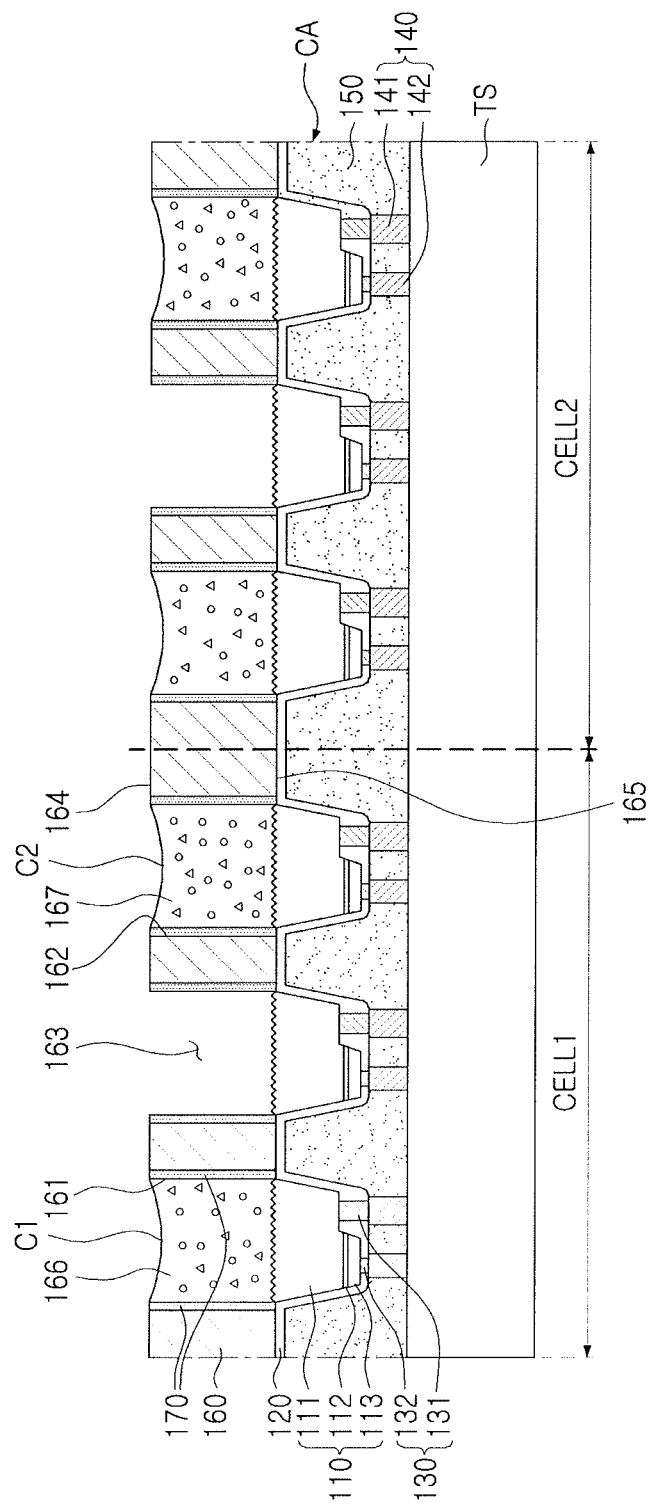

As illustrated in FIG. 9, subsequently, the first light emission window 161 may be filled with a photosensitive resin composition by coating with a photosensitive resin composition containing red quantum dots 166a, using a method such as spin coating or slit coating, to then be exposed, thereby forming a first wavelength conversion portion 166. A photosensitive resin composition may be applied to the partition structure 160 to be exposed under a mask having a predetermined pattern, to form quantum dots polymer composite, in which cross-linking polymerization occurs in an exposed region thereof and quantum dot particles are dispersed in a polymer matrix. Wavelengths and intensity of light used for exposure may be selected in consideration of the type and content of the quantum dots and the like. Similarly, a second wavelength conversion portion 167 may be formed by filling the second light emission window 162 with a photosensitive resin composition containing green quantum dots. As described above, in the process of coating the liquid photosensitive resin composition on the first and second light emission windows 161 and 162, concave meniscus C1 and C2 may be formed on surfaces of the first and second wavelength conversion portions 166 and 167.

Figure 10:
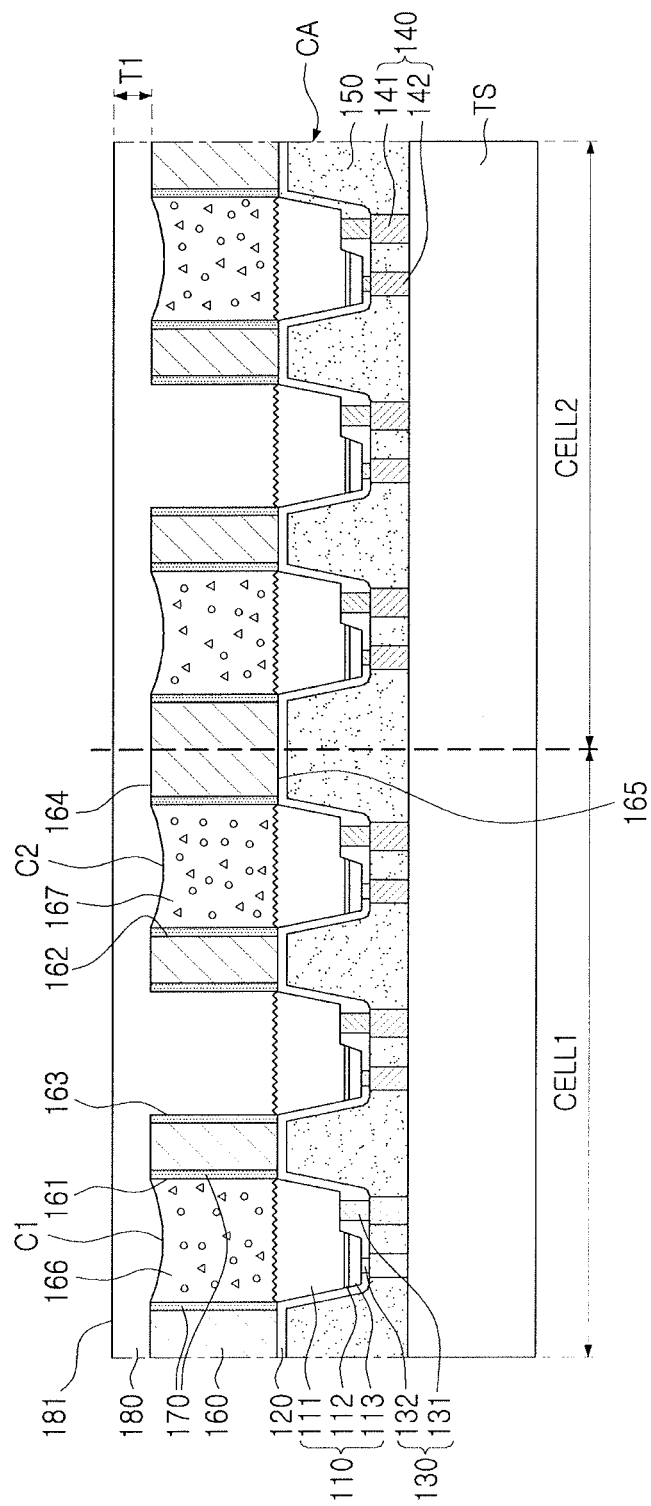

Next, as illustrated in FIG. 10, the first encapsulating portion 180 may be formed to fill the third light emission window 163 while covering the first and second wavelength conversion portions 166 and 167 and the partition structure 160. The first encapsulating portion 180 may be formed to have the thickness T1 sufficient to cover the partition structure 160 and form a flat surface on the upper surface 181. The thickness T1 of the first encapsulating portion 180 may be greater than that of the second encapsulating portion 190 to be described later, such that cracking occurring in the first encapsulating portion 180 due to stress of the second encapsulating portion 190 may be prevented.

Figure 11:
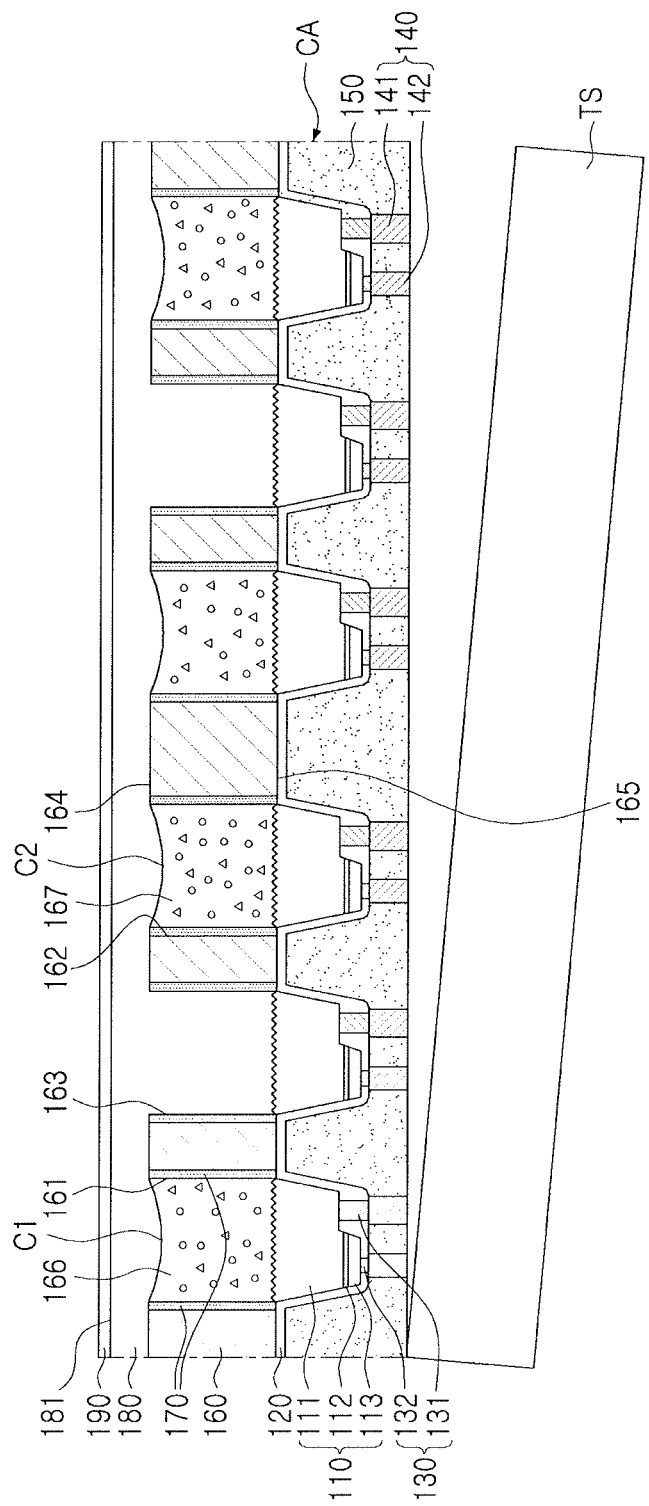

Next, as illustrated in FIG. 11, the second encapsulating portion 190 may be formed to cover the first encapsulating portion 180, and the temporary substrate IS may be separated from the cell array CA. In this case, to prevent damage to the cell array CA, a temporary support such as a portion of tape may be attached to the second encapsulating portion 190.

Figure 12:
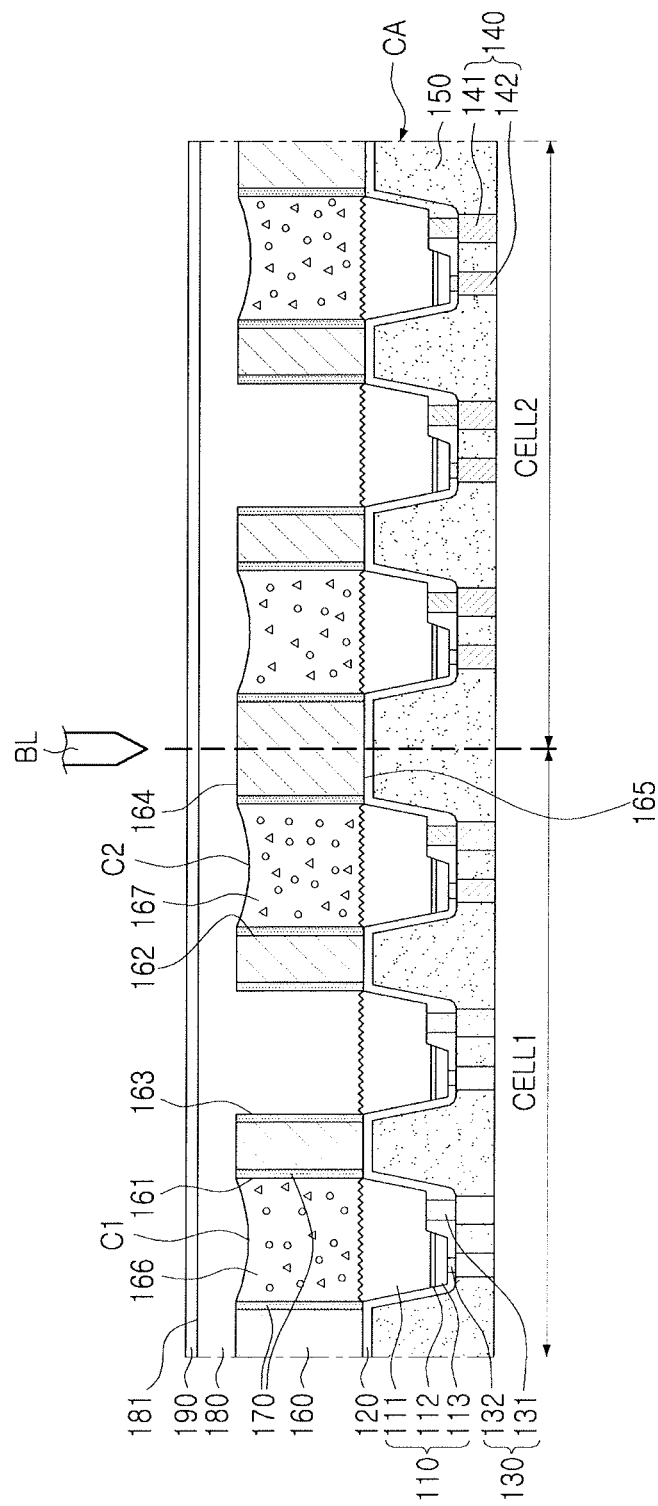

Next, as illustrated in FIG. 12, a process of cutting the partition structure 160 and the cell array CA into pixel units CELL1 and CELL2 may be performed using a blade BL to fabricate the light emitting device package 10 illustrated in FIG. 5. The process of cutting into pixel units CELL1 and CELL2 is not limited thereto, and a method of separation using a laser or a water jet, or the like, may also be used.

By way of summation and review, an aspect of the present disclosure is to provide a light emitting device package and a display apparatus having improved reliability. That is, as set forth above, a light emitting device package according to an example embodiment, and a display apparatus using the same, may prevent cracking from occurring in an encapsulating portion, thereby improving reliability. In particular, according to example embodiments, an encapsulant of an organic film material having ductility higher than that of an inorganic encapsulation material may be inserted into a lower portion of an encapsulant of an inorganic film material, and an upper face of the organic film encapsulant may be formed as a flat surface, thereby preventing cracking in inorganic film encapsulant.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A light emitting device package, comprising:
a partition structure having a first surface and a second surface opposing the first surface, the partition structure including first to third light emission windows penetrat- ing through the first surface and the second surface and spaced apart from each other;

a cell array including first to third light emitting devices, the cell array being on the first surface of the partition structure to have the first to third light emitting devices overlap the first to third light emission windows, respectively, each of the first to third light emitting devices including a first conductivity-type semiconductor layer, an active layer, and a second conductivity-type semiconductor layer;

first and second wavelength conversion portions filling interiors of the first and second light emission windows, each of the first and second wavelength conversion portions having an interface at which a meniscus, concave in a direction of the second surface, is defined;

a first encapsulating portion including a light-transmissive organic film layer, the first encapsulating portion being directly on the third light emitting device and filling an interior of the third light emission window above the third light emitting device, the first encapsulating portion having a uniform composition that extends continuously out of the third light emission window and directly contacts an entirety of an upper surface and the meniscus of each of the first and second wavelength conversion portions; and a second encapsulating portion covering the first encapsulating portion, the second encapsulating portion including a light-transmissive inorganic film layer.

2. The light emitting device package as claimed in claim 1, wherein the first and second wavelength conversion portions include quantum dots.

3. The light emitting device package as claimed in claim 1, wherein a thickness of the first encapsulating portion is greater than a thickness of the second encapsulating portion.

4. The light emitting device package as claimed in claim 1, wherein:
the first to third light emission windows have a rectangular shape elongated in a first direction when viewed from the first surface, and
a thickness of the first encapsulating portion is equal to 30% or less of a length of the rectangular shape in a second direction of the rectangular shape.

5. The light emitting device package as claimed in claim 1, wherein the first encapsulating portion includes an acrylic polymer, and the second encapsulating portion includes SiON.

6. The light emitting device package as claimed in claim 1, wherein a contact surface between the first encapsulating portion and the second encapsulating portion is a flat surface.

7. The light emitting device package as claimed in claim 1, wherein the first to third light emitting devices are parallel to each other, and the third light emitting device is between the first and second light emitting devices.

8. The light emitting device package as claimed in claim 1, wherein the first to third light emitting devices emit blue light.

9. The light emitting device package as claimed in claim 8, wherein the first and second wavelength conversion portions include quantum dots emitting red light and green light, respectively.

10. The light emitting device package as claimed in claim 1, wherein the first to third light emission windows include a reflective layer on side surfaces thereof.

11. The light emitting device package as claimed in claim 1, wherein there is no wavelength conversion portion in the third light emission window.

12. A light emitting device package, comprising:
a partition structure including first to third light emission windows spaced apart from each other in a width direction;
first and second wavelength conversion portions filling interiors of the first and second light emission windows, respectively, the first and second wavelength conversion portions to convert incident light into light having a different wavelength, and the first and second wavelength conversion portions having a meniscus-shaped interface;
a cell array including first to third light emitting devices, each of the first to third light emitting devices including a first conductivity-type semiconductor layer, an active layer, and a second conductivity-type semiconductor layer, the first to third light emitting devices overlapping the first to third light emission windows, respectively;
a first encapsulating portion filling an interior of the third light emission window, the first encapsulating portion having a uniform composition that extends continuously out of the third light emission window and directly contacts an entirety of an upper surface and the meniscus of each of the first and second wavelength conversion portions to define a flat surface, and the first encapsulating portion including a light-transmissive organic film layer; and
a second encapsulating portion covering the first encapsulating portion and including a light-transmissive inorganic film layer.

13. The light emitting device package as claimed in claim 12, wherein the first and second wavelength converting portions include a curable photosensitive resin composition, the curable photosensitive resin composition including quantum dots dispersed in a binder resin.

14. The light emitting device package as claimed in claim 13, wherein the binder resin includes a same composition as a composition of the light-transmissive organic film layer of the first encapsulating portion.

15. The light emitting device package as claimed in claim 14, wherein the binder resin includes an acrylic polymer.

16. The light emitting device package as claimed in claim 12, wherein the first encapsulating portion is directly on the third light emitting device in the third light emission window, the first encapsulating portion including a material exhibiting ductility higher than that of the second encapsulating portion.

17. The light emitting device package as claimed in claim 12, wherein the first encapsulating portion includes a same material composition in the interior of the third light emission window and on tops of the first and second wavelength conversion portions.

18. The light emitting device package as claimed in claim 12, wherein a thickness of the first encapsulating portion is greater than a thickness of the second encapsulating portion.

19. The light emitting device package as claimed in claim 18, wherein the thickness of the first encapsulating portion is equal to 10 µm or less.

20. A display apparatus, comprising
a display panel including a circuit board and a plurality of light emitting device packages arranged in rows and columns on the circuit board, each of the plurality of light emitting device packages providing one pixel;
a driver to drive the display panel; and
a controller to control the driver,
wherein each of the plurality of light emitting device packages includes:

a partition structure having a first surface and a second surface opposing the first surface, the partition structure including first to third light emission windows penetrating through the first surface and the second surface and spaced apart from each other, a cell array including first to third light emitting devices, the cell array being on the first surface of the partition structure to have the first to third light emitting devices overlap the first to third light emission windows, respectively, each of the first to third light emitting devices including a first conductivity-type semiconductor layer, an active layer, and a second conductivity-type semiconductor layer, first and second wavelength conversion portions filling interiors of the first and second light emission windows, each of the first and second wavelength conversion portions having an interface at which a meniscus, concave in a direction of the second surface, is defined, a first encapsulating portion including a light-transmissive organic film layer, the first encapsulating portion being directly on the third light emitting device and filling an interior of the third light emission window above the third light emitting device, the first encapsulating portion having a uniform composition that extends continuously out of the third light emission window and directly contacts an entirety of an upper surface and the meniscus of each of the first and second wavelength conversion portions, and a second encapsulating portion covering the first encapsulating portion, the second encapsulating portion including a light-transmissive inorganic film layer.

* * * * *